US007489523B2

(12) United States Patent  
Hsu

(10) Patent No.: US 7,489,523 B2  
(45) Date of Patent: Feb. 10, 2009

(54) FASTENING MECHANISM

(75) Inventor: Yung-Chin Hsu, Taipei (TW)

(73) Assignee: Inventec Corporation, Taipei (TW)

( * ) Notice: Subject to any disclaimer, the term of this patent is extended or adjusted under 35 U.S.C. 154(b) by 312 days.

(21) Appl. No.: 11/393,125

(22) Filed: Mar. 29, 2006

(65) Prior Publication Data

US 2007/0236906 A1    Oct. 11, 2007

(51) Int. Cl.
*H05K 7/12* (2006.01)
(52) U.S. Cl. ........................ 361/801; 361/759; 361/732; 361/747; 361/726
(58) Field of Classification Search ................ 361/759, 361/801, 726, 732, 740, 747
See application file for complete search history.

(56) References Cited

U.S. PATENT DOCUMENTS

| | | | | | |
|---|---|---|---|---|---|
| 5,268,820 | A | * | 12/1993 | Tseng et al. ................. | 361/785 |
| 5,442,520 | A | * | 8/1995 | Kemp et al. ................. | 361/785 |
| 5,623,396 | A | * | 4/1997 | Blackwell .................... | 361/801 |
| 6,017,004 | A | * | 1/2000 | Grantham ................... | 248/27.3 |
| 6,040,625 | A | * | 3/2000 | Ip .............................. | 257/719 |
| 6,185,104 | B1 | * | 2/2001 | Obermaier ................... | 361/759 |
| 6,220,887 | B1 | * | 4/2001 | Downs ........................ | 439/377 |
| 6,349,039 | B1 | * | 2/2002 | Boe ............................ | 361/801 |
| 6,396,685 | B1 | * | 5/2002 | Chien ......................... | 361/683 |
| 6,442,037 | B1 | * | 8/2002 | Boe ............................ | 361/759 |
| 6,608,756 | B2 | * | 8/2003 | Higashida et al. ........... | 361/748 |
| 6,870,744 | B2 | * | 3/2005 | Kosugi et al. ............... | 361/801 |
| 6,970,363 | B2 | * | 11/2005 | Bassett et al. ............... | 361/801 |
| 2003/0199188 | A1 | * | 10/2003 | Kosugi et al. ............... | 439/271 |

* cited by examiner

*Primary Examiner*—Dean A. Reichard
*Assistant Examiner*—Dameon E Levi
(74) *Attorney, Agent, or Firm*—Jianq Chyun IP Office

(57) ABSTRACT

A fastening mechanism for fastening a functional board onto circuit boards separately disposed in a casing of an electronic device is proposed, the fastening mechanism including: a pinch unit adapted to pinch-hold the functional board; an elastic unit disposed on the pinch unit and extending in a direction away from the functional board, such that when a cover board of the electronic device covers the casing, the elastic unit is pressed down by the cover board and is flexibly distorted to transfer action power generated from the flexible distortion to the pinch unit, thereby fixedly affixing the functional board onto the circuit boards of the electronic device and overcoming the defects of known techniques.

9 Claims, 4 Drawing Sheets

FASTENING MECHANISM

BACKGROUND OF THE INVENTION

1. Field of the Invention

The present invention relates to a fastening mechanism, and more particularly, to a fastening mechanism for fastening two circuit boards that are separately disposed to space apart in the casing of an electronic device.

2. Description of Related Art

The installation of servers becomes essential and critical for the technology and manufacture industries. With the increasing powerful functions of the server installation, more and more electrical components are required to be configured in electronic devices, which in turn necessitates more circuits to be disposed and connected to the circuit board, including the heat-dissipating fan additionally adapted for increasing the performance of an electronic device, leading to a crowding and disorganizing configuration and causing inconvenience in disassembly due to the crowded circuits disposed in an electronic device.

Due to the maturity of a multi-layered circuit board technology in recent years and the integration of circuits, it is commonly adopted that a number of component circuits that need to be disposed closely in the mainframe board such as a flash memory battery, a hardware wire, and a fan controller are integrated to form an integrated circuit board. After integration of multiple circuits a bridge connecting board is then electrically connected to the mainframe board, allowing the mainframe board to obtain full information from each component while reducing the space occupied by each component to be disposed therein.

However, the bridge connecting board used for electrically connecting the mainframe board and integrated circuits is only electrically connected, a flip loosening problem is likely to occur in drop tests and shock tests. Since a bridge connecting board transmits important signals relating to an initial power-on stage, there exists a need in the art to develop an improved fastening mechanism that can securely fasten the bridge connecting card.

Referring to FIG. 1, a conventional fastening structure for a bridge connecting board is illustrated, a mainframe board 11 and an integrated circuit board 12 are electrically connected to two respective ends on one side of the bridge connecting board 10, the bridge connecting board 10 consisting of two positioning openings 101 respectively and inwardly disposed on both ends thereof, and a plurality of related hooks 110 is respectively provided on the electrical connecting points of the mainframe board 11, the integrated circuit board 12, and at a position adjacent to the bridge connecting board 10 that corresponds to said positioning openings 101 and is related to the installation of the bridge connecting board 10. When the bridge connecting board 10 is evenly and downwardly pressed by a user for being installed on the mainframe board 11 and the integrated circuit board 12, the related hook 110 is relatively moved to couple with the positioning opening 101, thereby affixing the bridge connecting board 10 to an electronic device by means of the coupling of the related hook 110 and the positioning opening 101.

However, in practical applications, it is often cumbersome and difficult to install a bridge connecting board to an electronic device, for a user is required to exert an even force on both ends of the bridge connecting board so as to install the bridge connecting board onto the electrical connecting grooves of the mainframe board 11 and the integrated circuit board 12. It takes time and repeated operations to be able to fixedly couple the related hook 110 with the positioning opening 101 and is inefficient and inconvenient to use.

In addition, there also exist a cost concern in the fabrication of a conventional fastening mechanism for a bridge connecting board. As can be seen from FIG. 1, the bridge connecting board 10 needs to be provided with a plurality of positioning openings 101 thereon, and so as a plurality of related hooks is required to be disposed on the mainframe board 11 and the integrated circuit board 12 that require separate processing steps, thereby adversely increasing the manufacturing cost for the bridge connecting board 10, the mainframe board 11, and the integrated circuit board 12.

Further, the disposal of the related hook 110 would undesirably occupy the valuable space on the mainframe board 11 and the integrated circuit board 12. Particularly when replacing the bridge connecting board 10, it is necessary to move the related hook 110 outwardly and that necessitates reservation of a space on the outside of the electrical connecting groove, adversely affecting the flexibility in using the space on the mainframe board 11 and the integrated circuit board 12.

Moreover, the fastening of memories (any one of S-RAM, D-RAM, SD-RAM, DDR-RAM, DDR2-RAM, RAMBUS) also share the same problem as described above. For example, the fastening method of a PCI card typically has one end thereof being affixed by screws, which often causes the PCI card unable to be easily inserted into the electrical inserting groove of the mainframe board, for if the screw is fastened too tight the other end may raise up whereas if too loose, it tends to sway. Therefore, how to provide a novel and improved method for fastening the bridge connecting board with other functional boards, is a critical need in the art.

SUMMARY OF THE INVENTION

In view of the above-mentioned problems of the prior art, it is a primary objective of the present invention to provide a fastening mechanism that helps to rapidly fasten and disassemble a functional board onto and from an electronic device.

Another objective of the present invention to provide a fastening mechanism that helps to fixedly fasten a functional board onto an electronic device.

Still another objective of the present invention is to provide a fastening mechanism that helps to reduce the manufacturing cost required for fastening a functional board onto an electronic device.

To achieve the above-mentioned and other objectives, a fastening mechanism for a functional board is provided according to the present invention. The fastening mechanism is used to fasten a functional board onto circuit boards disposed and spaced apart in a casing of an electronic device, the fastening mechanism comprising: a pinch unit adapted to pinch-hold the functional board; an elastic unit relatively disposed on said pinch unit and extending in a direction away from said functional board, such that when a cover board of the electronic device covers the casing, said elastic unit is pressed down and flexibly crooked and transfers the action power generated from the flexible distortion to said pinch unit, thereby fixedly affixing the functional board onto circuit boards of an electronic device.

The fastening mechanism is applicable to the vertical insertion of a functional board for electronic devices that includes server devices, PC's and Notebook computers, such as a bridge connecting board. Said bridge connecting board can respectively and electrically connect to a mainframe board and an integrated circuit board disposed and spaced apart from said mainframe board, said integrated circuit board being adapted to integrate a fan controller, a flash-memory battery, and a circuit board for storing hardware data, and to connect to said mainframe board by said bridge connecting board, thereby transferring data between the functional board and the mainframe board.

Preferably, said pinch unit is a block body having a groove formed thereon towards the direction of the functional board for embedding said functional board therein. Said pinch unit further includes a strengthening portion to reinforce the stability and balance of the coupling of said pinch unit with said functional board, wherein said strengthening portion is composed of a plurality of protrusions correspondingly disposed on both sides of said groove. Said elastic unit can be a plurality of spring arms formed in a direction away from said functional board, and further includes a pressing portion formed on an end of said elastic unit that can be disposed flatly against said cover board to balance the pressure of said elastic unit. Said pinch unit and said elastic unit are made of an insulating material, and said elastic unit is integrally formed in said pinch unit.

Compared to the prior techniques that require specific skills, cause inconvenience, and increase the manufacturing cost as mentioned above, the fastening mechanism proposed by the present invention can improve on the prior art by using a pinch unit to pinch-hold one side of the functional board, having the cover board press the elastic unit to fasten the board onto circuit boards of an electronic device. And as the fastening mechanism can be integrally formed without requiring extra processing on electronic components or devices, thereby desirably reducing the cost as a result. Moreover, the fastening mechanism according to the invention can replace the use of screws to fixedly and rapidly fasten a PCI card onto a mainframe board, and also is easy to disassemble when required. Therefore, the present invention yields advantages over the prior part as it is easy and fast to install and disassemble, is cost-effective, and has passed the drop tests to be a highly reliable product having industrial value.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects being readily understood by those in the art after reading the disclosure of this specification. The present invention can also be performed or applied by other differing embodiments. The details of the specification may be modified on the basis of different points and applications, and numerous modifications and variations can be devised without departing from the spirit of the present invention.

Figure 1:
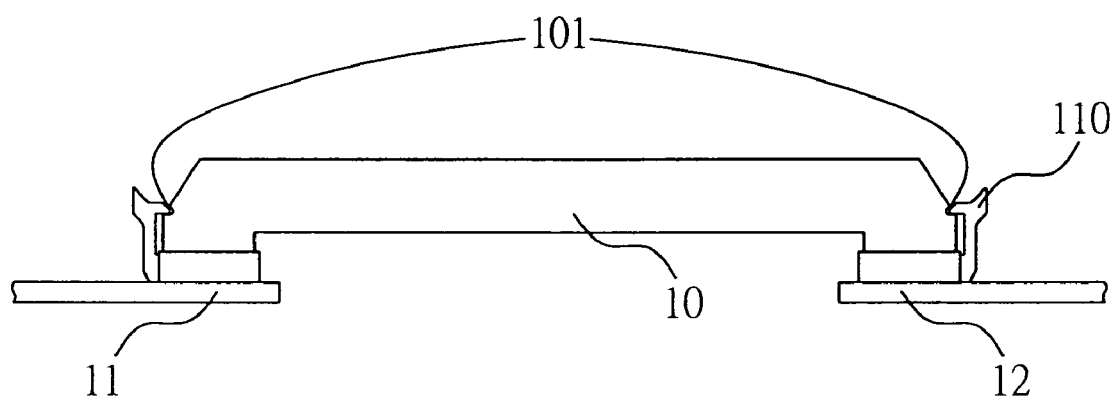
FIG. 1 (PRIOR ART) is a schematic view showing a conventional method of fastening a bridge connecting board.
Figure 2A:
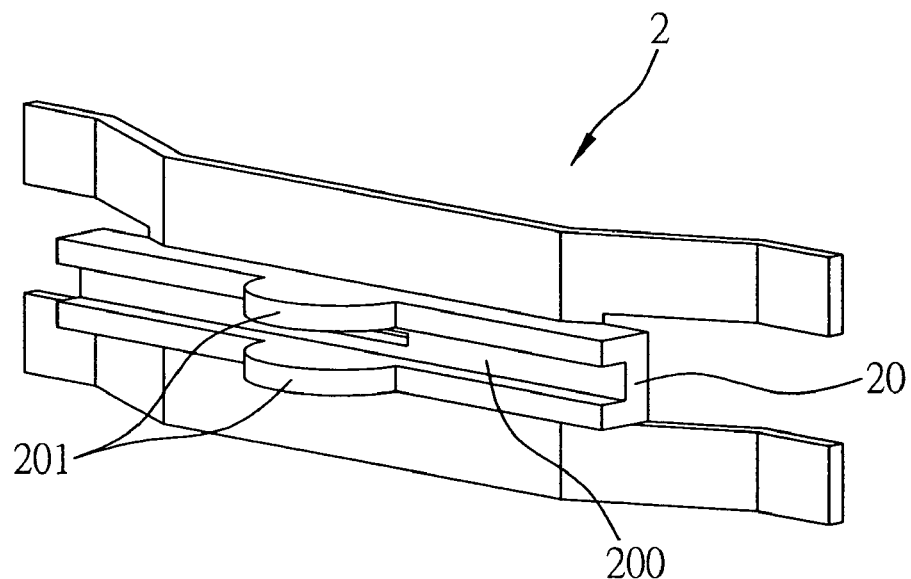
FIGS. 2A and 2B are schematic views showing the fastening mechanism for fastening a functional board according to the present invention.
Figure 2B:
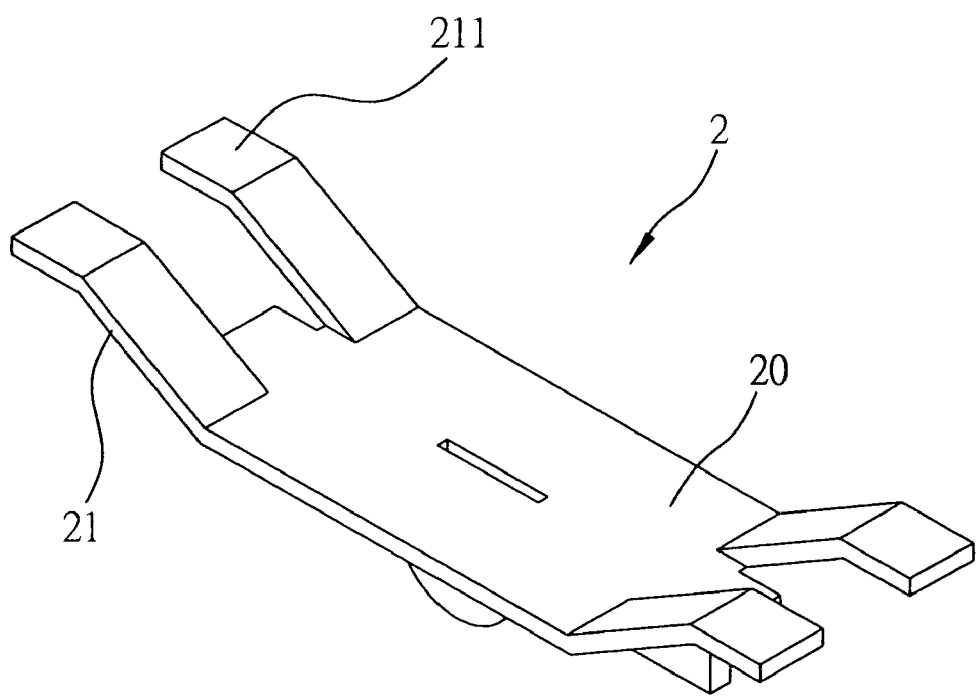
Figure 3:
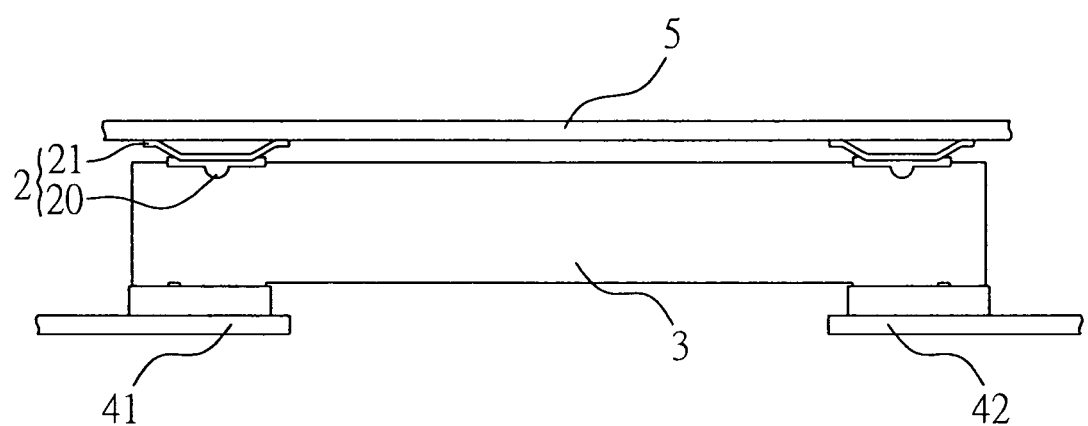
FIG. 3 is a cross-sectional view showing a preferred embodiment of the fastening mechanism for fastening a functional board according to the present invention.
Figure 4:
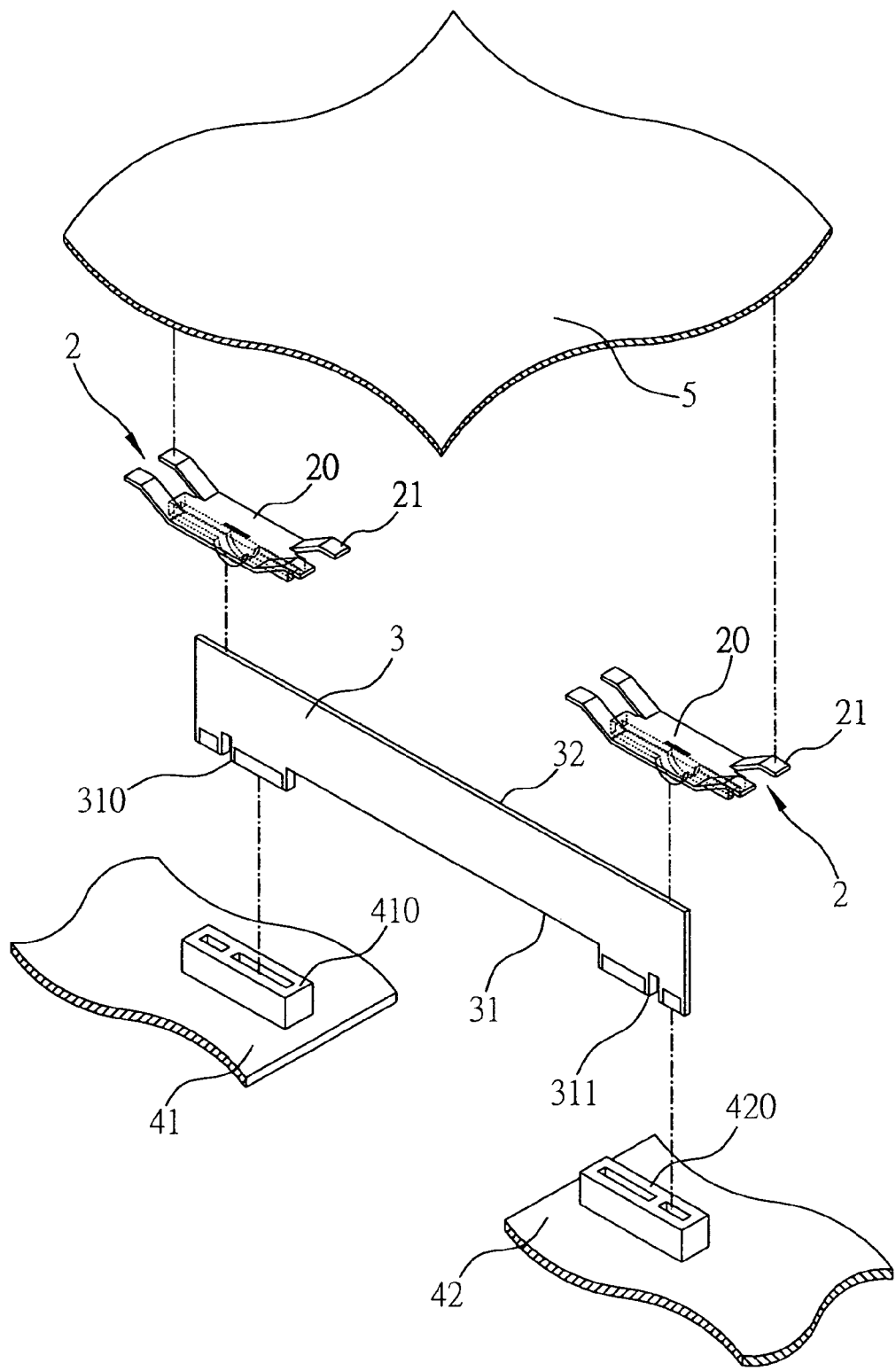
FIG. 4 is an exploded view showing the preferred embodiment of the fastening mechanism for fastening a functional board according to the present invention.

FIGS. 2 through 4 are drawn according to the preferred embodiment of the fastening mechanism of a functional board of the present invention. Note that the fastening mechanism described in the following embodiment can be applied to any one of the functional boards including a bridge connecting board, a memory, or a functional board of a PCI card to electronic devices such as a server device, a PC, a Notebook computer, and so forth. Although the fastening of a functional board to a bridge connecting board is exemplified in this embodiment but it is not to be limited to this embodiment. Also, since the present invention is applicable to a conventional memory, a PCI card, or other functional boards to be fastened to circuit boards of an electronic device, and the structure of the invention remains unchanged regardless of the chosen application, the accompanying drawings only show partial structures that are directly related to the invention for simplification and the remaining parts are purposely omitted herein.

FIGS. 2A and 2B are schematic views showing the fastening mechanism for a functional board according to the invention, the fastening mechanism 2 comprising a pinch unit 20 adapted to pinch-hold a functional board 3; an elastic unit 21 relatively disposed on said pinch unit 20 for fastening the functional board 3 to be vertically inserted to circuit boards of an electronic device. The pinch unit 20 and the elastic unit 21 are made of an insulating material, and said elastic unit 21 is integrally formed in the pinch unit 20.

Referring to FIG. 3, the fastening mechanism 2 is adapted to fasten two circuit boards 41, 42 that are separately disposed in a casing of an electronic device (not shown), said elastic unit 21 extending in a direction away from said functional board 3, such that when a cover board 5 of the electronic device covers the casing, said elastic unit 21 is pressed down and flexibly crooked and transfers the action power generated from the flexible distortion to said pinch unit 20, thereby fixedly affixing the functional board 3 onto circuit boards 41, 42 of said electronic device.

Said circuit boards 41, 42 are each a mainframe board and an integrated circuit board that are intermittently disposed in an electronic device, wherein said integrated circuit board integrates circuits of a flash memory battery, a hardware wire, and a fan controller (not shown). Said functional board is a bridge connecting board electrically connected to the mainframe board and the integrated circuit board.

Said elastic unit 21 is a plurality of spring arms extending from the pinch unit 20 towards a direction away from said functional board 3. Said elastic unit 21 further includes a pressing portion 211 formed at an end of said elastic unit 21 and can be flatly disposed against said cover board 5 to balance the pressure of said elastic unit 21.

Said pinch unit 20 is a block body having a groove 200 formed towards the direction of the functional board 3 for embedding said functional board 3 therein. Said pinch unit 20 further includes a strengthening portion 201 to reinforce the stability and balance of the coupling of said pinch unit 20 with said functional board 3, wherein said strengthening portion 201 is composed of a plurality of protrusions correspondingly disposed on both sides of said groove 200.

Note that the form of the elastic unit 21 and the pinch unit 20 may vary and are not limited to the embodiment, and the modifications thereto can be carried out by persons having ordinary skills in the art.

Referring to FIG. 4, an exploded view showing the cover board 5 of an electronic device, the fastening mechanism 2, the functional board 3 such as a bridge connecting board, and circuit boards 41, 42 of the embodiment is illustrated. A first electrical connecting portion 310 and a second electrical connecting portion 311 are respectively formed on a first side 31 of the functional board 3, on which a first electrical connecting groove 410 of the circuit board 41 and a second electrical connecting groove 420 of the circuit board 42 are respectively disposed. The fastening mechanism 2 is embedded into a second side 32 of the functional board 3 by means of the pinch unit 20 at a position opposite the first side 31 having the first electrical connecting portion 310 and the second electrical connecting portion 311, and the elastic unit 21 is pressed by the cover board 5 to embed into the second side 21 by means of said pinch unit 20, thereby restricting the functional board 3 to fixedly insert onto circuit boards 41, 42.

Said pinch unit 21 holds a position at the second side 32 opposite to the first side and having an electrical connecting portion so as to balance the pressure of the functional board 3, and also with the auxiliary of the strengthening portion 201 and the pressing portion 211, the stability of the fastening mechanism is desirably increased. Conversely, when the cover board 5 is opened the pressure on said functional board 3 is relieved so that necessary maintenance or replacement of the functional board 3 can be easily and rapidly carried out.

Compared to the prior techniques, the fastening mechanism is simple and easy to implement as it uses a pinch unit to pinch-hold one side of the functional board, has the cover board press the elastic unit to fasten the board onto the circuit boards of an electronic device. And as the fastening mechanism can be integrally formed without requiring extra processing on the electronic components or devices, thereby desirably reducing the cost as a result. Moreover, the fastening mechanism according to the invention can replace the use of screws to fixedly and rapidly fasten a PCI card onto the mainframe board, and also is easy to disassemble when required. Therefore, the present invention yields advantages over the prior part as it is easy and fast to install and disassemble, is cost-effective, and has passed the drop tests to be a highly reliable product having industrial value.

The foregoing descriptions of the detailed embodiments are illustrated to disclose the features and functions of the present invention and are not restrictive of the scope of the present invention. It should be understood by those in the art that various modifications and variations can be made to the present invention according to the spirit and principle in the disclosure and yet fall within the scope of the appended claims.

What is claimed is:

1. A fastening mechanism for fastening a functional board onto circuit boards disposed and spaced apart in a casing of an electronic device, the fastening mechanism comprising:
   a pinch unit adapted to pinch-hold the functional board;
   an elastic unit disposed on the pinch unit and has a plurality of spring arms extending in a direction away from the functional board, each of the spring arms includes a pressing portion formed at an end thereof, such that when a cover board of the electronic device covers the casing, the elastic unit is pressed down by the cover board and the pressing portions leveled against the cover board to balance the pressure from the cover board.

2. The fastening mechanism of claim 1, wherein the pinch unit and the elastic unit are made of an insulating material.

3. The fastening mechanism of claim 1, wherein the elastic unit is integrally formed on the pinch unit.

4. The fastening mechanism of claim 1, wherein the pinch unit is a block body having a groove formed in a direction towards the functional board, for being engaged with the functional board.

5. The fastening mechanism of claim 4, wherein the pinch unit further includes a strengthening portion adapted to strengthen balance and stability of the pinch unit being engaged with the functional board.

6. The fastening mechanism of claim 5, wherein the strengthening portion is composed of protrusions disposed on both sides of the groove.

7. The fastening mechanism of claim 1, wherein the circuit boards refer to a main board and an integrated circuit board.

8. The fastening mechanism of claim 1, wherein the functional board is a bridge connecting board for electrically interconnecting the circuit boards.

9. The fastening mechanism of claim 1, wherein the pressing portions are co-planar at an end of the spring arms.

* * * * *